United States Patent
Hashimoto et al.

(10) Patent No.: US 6,622,296 B2
(45) Date of Patent: Sep. 16, 2003

(54) EXPOSURE MASK PATTERN CORRECTION METHOD, PATTERN FORMATION METHOD, AND A PROGRAM PRODUCT FOR OPERATING A COMPUTER

(75) Inventors: Koji Hashimoto, Yokohama (JP); Soichi Inoue, Yokohama (JP); Satoshi Tanaka, Kawasaki (JP); Satoshi Usui, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/127,770

(22) Filed: Apr. 23, 2002

(65) Prior Publication Data

US 2002/0157083 A1 Oct. 24, 2002

(30) Foreign Application Priority Data

Apr. 23, 2001 (JP) ........................................ 2001-124683

(51) Int. Cl.[7] ................................................ G06F 17/50
(52) U.S. Cl. ................................ 716/19; 716/21; 430/5
(58) Field of Search ........................ 716/19–21; 430/5, 430/30

(56) References Cited

U.S. PATENT DOCUMENTS 6,077,310 A * 6/2000 Yamamoto et al. ............ 716/19
6,335,130 B1 * 1/2002 Chen et al. ..................... 430/5
6,541,167 B2 * 4/2003 Petersen et al. ............... 716/19

FOREIGN PATENT DOCUMENTS

JP 9-319067 12/1997
JP 11-168065 6/1999

OTHER PUBLICATIONS

Liebmann et al., "Optical Proximity Correction, a First Look at Manufacturability", in *14th Annual BACUS Symposium on Photomask Technology and Management*, William L. Brodsky, Gilbert V. Shelden, Editors, Proc. SPIE 2322, pp. 229–238, 1994.

* cited by examiner

Primary Examiner—Leigh M. Garbowski
Assistant Examiner—Paul Dinh
(74) Attorney, Agent, or Firm—Finnegan, Henderson, Farabow, Garrett & Dunner, L.L.P.

(57) ABSTRACT

An exposure mask pattern correction method comprises preparing a unit process group which includes a plurality of unit processes to form a pattern on a substrate by using an exposure mask, the plurality of unit processes including a unit process concerning manufacture of the exposure mask, a unit process concerning lithography using the exposure mask, and a unit process concerning etching of the substrate, setting a correction rule/model to perform an optical proximity effect correction for the exposure mask by using first and second optical proximity effects data when a change is arisen in at least one of the plurality of unit processes, the first and second optical proximity effect data being data respectively concerning an optical proximity effect caused by the at least one unit process before and after the change, and performing the optical proximity effect correction for the exposure mask by using the correction rule/model.

20 Claims, 16 Drawing Sheets

FIG. 13A
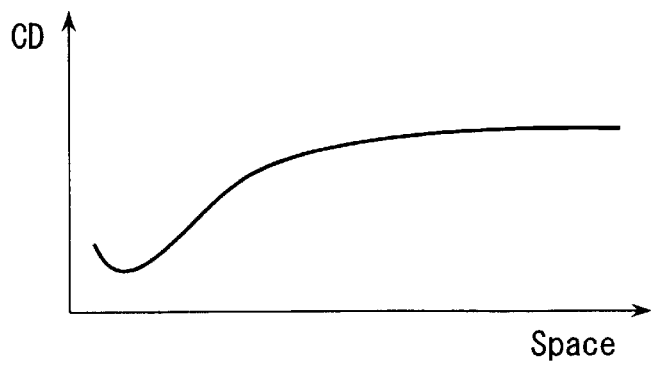
FIG. 13B
Acquire 1D OPE curve using OPC TEG (with fixed coverage ratio)
Prepare OPC rule/model and develop it into product
FIG. 14A
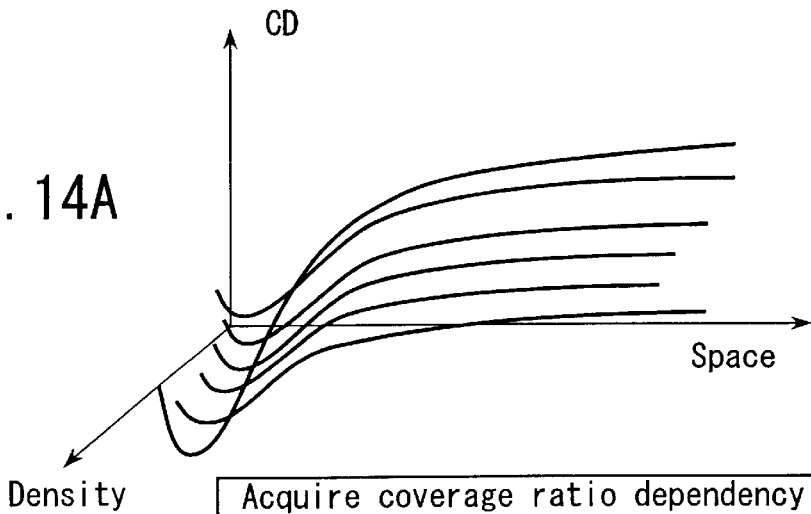
Acquire coverage ratio dependency of 1D OPE curve using OPC TEG (with different coverage ratios)
FIG. 14B
Prepare OPC rule/model from OPE curve corresponding to coverage ratio of product and develop OPC rule/model into product

EXPOSURE MASK PATTERN CORRECTION METHOD, PATTERN FORMATION METHOD, AND A PROGRAM PRODUCT FOR OPERATING A COMPUTER

CROSS-REFERENCE TO RELATED APPLICATIONS

This application is based upon and claims the benefit of priority from the prior Japanese Patent Application No. 2001-124683, filed Apr. 23, 2001, the entire contents of which are incorporated herein by reference.

BACKGROUND OF THE INVENTION

1. Field of the Invention

The present invention relates to an exposure mask pattern correction method, pattern formation method, and a program product for operating a computer and, more particularly, to an exposure mask pattern correction method of reducing the influence of the optical proximity effect, a pattern formation method, and a program product for operating a computer.

2. Description of Related Art

In recent years, demands have arisen more and more for miniaturizing the circuit patterns of semiconductor devices. Along with this, even if an exposure mask is prepared in accordance with a design pattern, the pattern of the design pattern cannot be formed on a wafer. This phenomenon is called OPE (Optical Proximity Effect) on the wafer.

OPEs are roughly classified into one caused by the mask process, one caused by the lithography process, and one caused by the etching process. More specifically, in the lithography process, OPE occurs due to the resist developing. In the etching process, OPE occurs due to loading effect. In the lithography process, OPE occurs due to an optical factor. In the mask and etching processes, OPE is not caused by any optical factor.

As a technique of correcting OPE, various OPCs (Optical Proximity Corrections) have been proposed. FIG. 16 shows a sequence of preparing of a correction rule (to be referred to as an OPC rule hereinafter for a rule-based OPC) or a correction model (to be referred to as an OPC model hereinafter for the rule-based OPC) for performing OPC, and feedback of the OPC rule or OPC model (OPC rule/model) to a product.

As shown in FIG. 16, when an OPC rule/model is to be prepared, an evaluation mask called an OPC TEG mask is prepared by using design data and the same etching process as that of the product. A resist pattern is formed on a wafer by using the evaluation mask and the same lithography process as that of the product. The wafer is processed by using the resist pattern and the same etching process as that of the product, thereby preparing an evaluation wafer. After that, the evaluation wafer undergoes OPE evaluation. A rule/model for making the pattern formed on the evaluation wafer coincide with the pattern of the design data, i.e., an OPC rule/model is prepared. The OPC rule/model is applied to the preparation of the main body mask of the product.

FIG. 17 shows a method of obtaining a conventional OPC model. In this method, coefficients Ci and $\Delta$Li of a multi-Gaussian function G are so selected as to make a wafer size ($CD_{exp}$) obtained by an experiment and a wafer size ($CD_{sim}$) obtained by calculation coincide with each other ($CD_{exp} = CD_{sim}$).

A group of unit processes (mask process, lithography process, etching process, and the like) for a product subjected to OPC and a group of unit processes for an evaluation mask prepared to form an OPC rule/model must be the same.

This is because, if these unit process groups are different from each other, the OPE of the evaluation wafer and that of the product become different from each other. The prepared OPC rule/model may become invalid.

A plurality of unit processes (mask process, lithography process, and etching process) which constitute the unit process group for the product are being improved with the flow of development. Even after the OPC rule/model is determined once, any of the unit processes for the process may be changed.

In this case, in the prior art, a new evaluation wafer is prepared by using the same unit process group as that for the product including the changed unit process. A new OPC rule/model is prepared from the OPE evaluation result of the evaluation wafer.

However, a long time is taken to prepare an OPC rule/model. Then, it causes a problem that a long time is required to practice a product pattern formation method which reflects the new OPC rule/model.

BRIEF SUMMARY OF THE INVENTION

An exposure mask pattern correction method according to an aspect of the present invention comprises preparing a unit process group which includes a plurality of unit processes to form a pattern on a substrate by using an exposure mask, the plurality of unit processes including a unit process concerning manufacture of the exposure mask, a unit process concerning lithography using the exposure mask, and a unit process concerning etching of the substrate; setting a correction rule or a correction model to perform an optical proximity effect correction for the exposure mask by using first and second optical proximity effects data when a change is arisen in at least one of the plurality of unit processes, the first optical proximity effect data being data concerning an optical proximity effect caused by the at least one unit process before the change, and the second optical proximity effect data being data concerning an optical proximity effect caused by the at least one unit process after the change; and performing the optical proximity effect correction for the exposure mask by using the correction rule or the correction model.

A semiconductor device manufacturing method according to an aspect of the present invention comprises preparing a unit process group which includes a plurality of unit processes to form a pattern on a substrate by using an exposure mask, the plurality of unit processes including a unit process concerning manufacture of the exposure mask, a unit process concerning lithography using the exposure mask, and a unit process concerning etching of the substrate; setting a correction rule or a correction model to perform an optical proximity effect correction for the exposure mask by using first and second optical proximity effects data when a change is arisen in at least one of the plurality of unit processes, the first optical proximity effect data being data concerning an optical proximity effect caused by the at least one unit process before the change, and the second optical proximity effect data being data concerning an optical proximity effect caused by the at least one unit process after the change; performing the optical proximity effect correction for the exposure mask by using the correction rule or the correction model; and forming the pattern on the substrate by using the exposure mask having undergone the optical proximity effect correction.

A program product for operating a computer according to an aspect of the present invention comprises a computer readable medium; a first program instruction which is recorded on the medium and causes the computer to load a unit process group that includes a plurality of unit processes to form a pattern on a substrate by using an exposure mask, the plurality of unit processes including a unit process concerning manufacture of the exposure mask, a unit process concerning lithography using the exposure mask, and a unit process concerning etching of the substrate; and a second program instruction which is recorded on the medium and used to set a correction rule or a correction model to perform an optical proximity effect correction for the exposure mask by using first and second optical proximity effects data when a change is arisen at least one of the plurality of unit processes, the first optical proximity effect data being data concerning an optical proximity effect caused by the at least one unit process before the change, and the second optical proximity effect data being data concerning an optical proximity effect caused by the at least one unit process after the change.

BRIEF DESCRIPTION OF THE SEVERAL VIEWS OF THE DRAWING

FIGS. 13A and 13B are views for explaining OPC which does not consider any pattern coverage ratio;

FIGS. 14A and 14B are views for explaining OPC which considers the pattern coverage ratio;

DETAILED DESCRIPTION OF THE INVENTION

Preferred embodiments of the present invention will be described below with reference to the several views of the accompanying drawing.

(First Embodiment)

Figure 1:
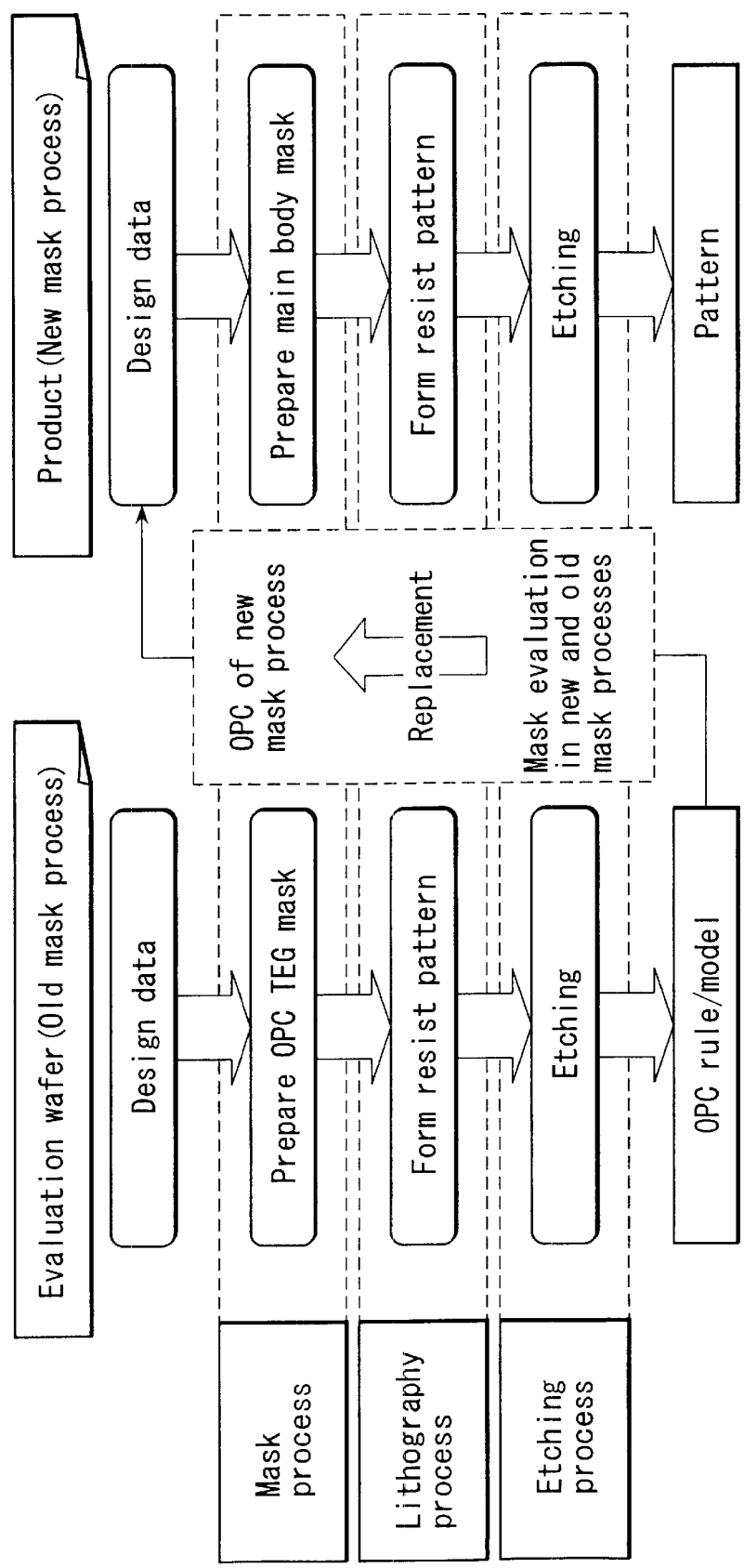
FIG. 1 is a flow chart showing the flow of a pattern formation method according to the first embodiment of the present invention when part of a unit process group is changed.

FIG. 1 is a flow chart showing the flow of a pattern formation method according to the first embodiment of the present invention when part of a unit process group is changed. This embodiment will exemplify a case wherein, of unit processes which constitute the unit process group, a process (mask process) concerning the manufacture of an exposure mask has been changed.

The change of the mask process includes the change of processes such as a writing process in preparing an exposure mask, a resist process, and an etching process for a light-shielding film on a glass substrate. The change of the mask process also includes the change of sub-processes which constitute these processes. The target pattern is, e.g., a circuit pattern formed on an Si substrate (Si wafer).

When the unit process (in this case, mask process) is changed, the OPC rule/model must be newly formed for the exposure mask pattern correction method.

The feature of the present embodiment is a method of preparing this new OPC rule/model. The remaining part is the same as a conventional pattern formation method. In the following description, the new OPC rule/model preparation method will be mainly explained.

In this embodiment, an OPC rule/model (new OPC rule/model) for a new mask process is obtained on the basis of optical proximity effect data of an evaluation mask obtained by a mask process (old mask process) before change and optical proximity effect data of an evaluation mask obtained by a mask process (new mask process) concerning the manufacture of an exposure mask after change.

Of OPC rules/models (old OPC rules/models) before the change of the mask process, an OPC rule/model in the mask process is replaced by the OPC rule/model in the new mask process.

The obtained OPC rule/model (new OPC rule/model) is employed to prepare an exposure mask (main body mask) used to form the circuit pattern of an actual product. Then, the product pattern process is updated.

Figure 2:
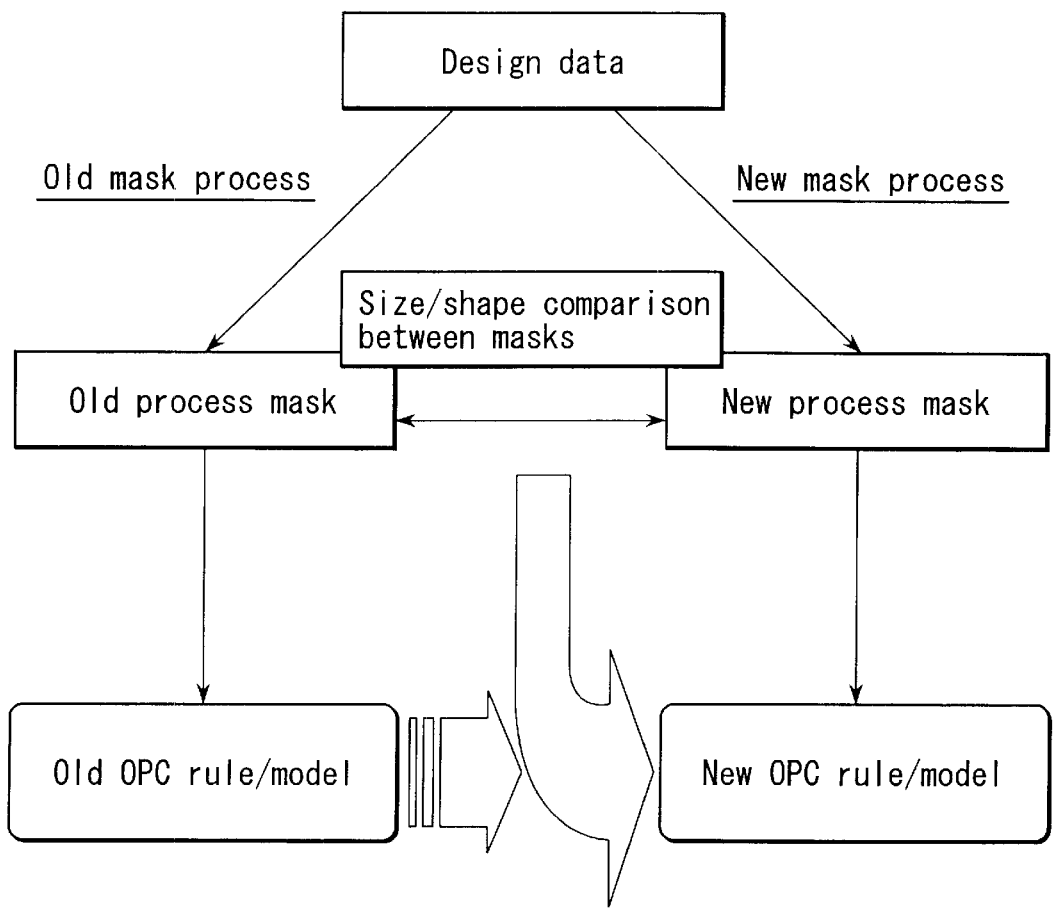
FIG. 2 is a flow chart showing the flow of a new OPC rule/model acquisition method according to the first embodiment of the present invention.

As shown in FIG. 2, information necessary to prepare an OPC rule/model in the new mask process suffices to be the old OPC rule/model, and the mask size difference or mask shape difference (sectional shape difference or planar shape difference) between new and old mask processes.

The old OPC rule/old OPC model has already been acquired. A new evaluation item necessary to prepare a new OPC rule/model is only the mask size difference or mask shape difference between new and old mask processes. The present embodiment enables preparing a new OPC rule/model within a shorter time more easily than a conventional method.

Figure 3A:
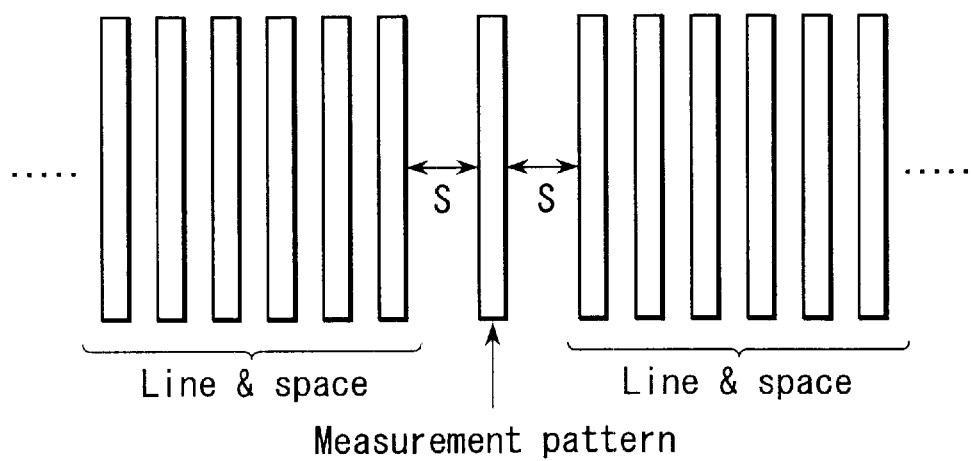
FIGS. 3A to 3C are views for explaining one-dimensional OPC replacement.
Figure 3B:
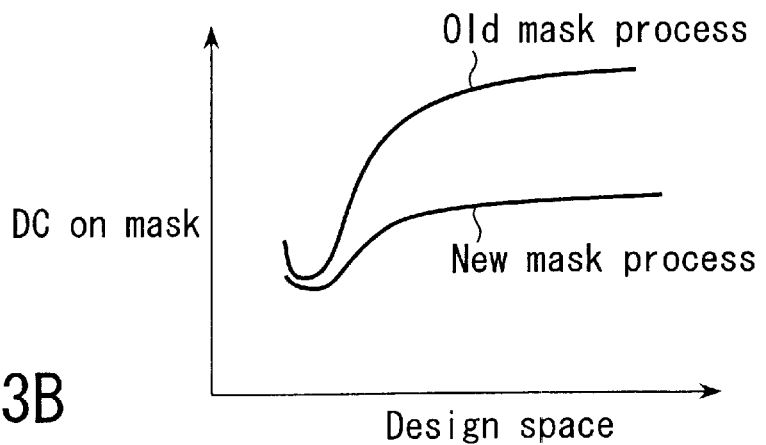
Figure 3C:
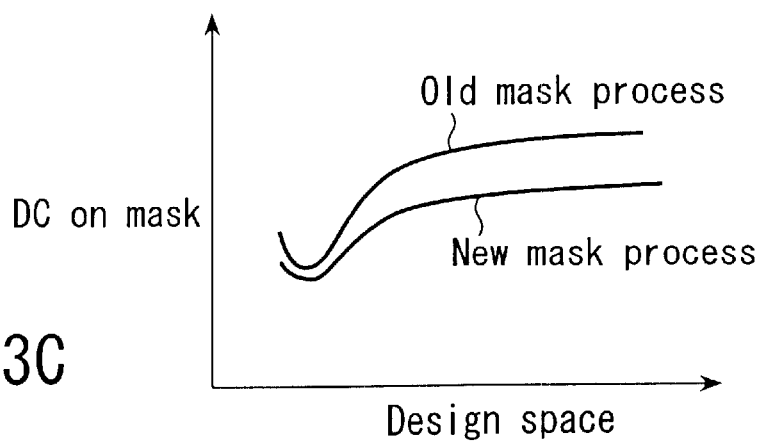

Replacement of an OPC rule/model (one-dimensional OPC replacement) upon changing the mask process will be explained in detail with reference to FIGS. 3A to 3C. Here, the replacement of an OPC rule/model means alternating the OPC rule/model in the old process into the OPC rule/model in the new process by preparing and evaluating the old and new evaluation masks without preparing and evaluating the old and new evaluation wafer. As shown in FIG. 3A, a pattern whose distance S (design space) up to the nearest pattern of a measurement pattern is employed as an evaluation pattern.

Here, one-dimension means that it requires one parameter (coordinate) to define a part or all part of shape of a pattern viewed from above. For example, in case, the pattern viewed from above is line pattern, the parameter is width of the line. Similarly two-dimension means that it requires two parameters (coordinates) to define a part or all part of shape of a pattern viewed from above. For example, in case, the pattern viewed from above is a line pattern, the parameters are an arc length of a edge of the pattern and a curvature of the edge. In case, the pattern is a circular hole, the parameters are a center and a diameter. In case, the pattern is rectangular pattern the parameters are short and long sides.

An exposure mask having the evaluation pattern of FIG. 3A is prepared using the old mask process. The relationship (one-dimensional OPE curve) between a width CD of the measurement pattern and the distance S (design space) from the measurement pattern up to its nearest pattern on an exposure mask in the old mask process is acquired (step 1). The width CD is a measurement value, and the distance S (design space) is a design value. Similarly, the relationship between CD and the design space on an exposure mask in the new mask process is acquired using the new mask process (step 2). The results of steps 1 and 2 are shown in FIG. 3B.

Figure 5A:
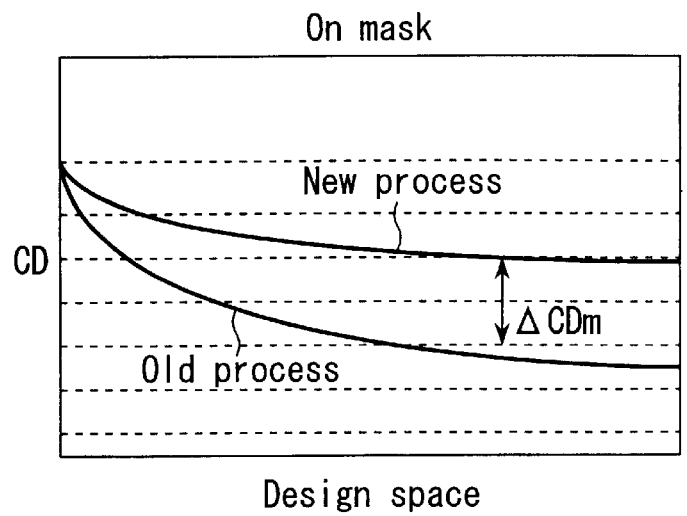
FIGS. 5A and 5B are graphs for explaining a method of acquiring wafer data in a new mask process from mask data in the new and old mask processes and wafer data in the old mask process.
Figure 5B:
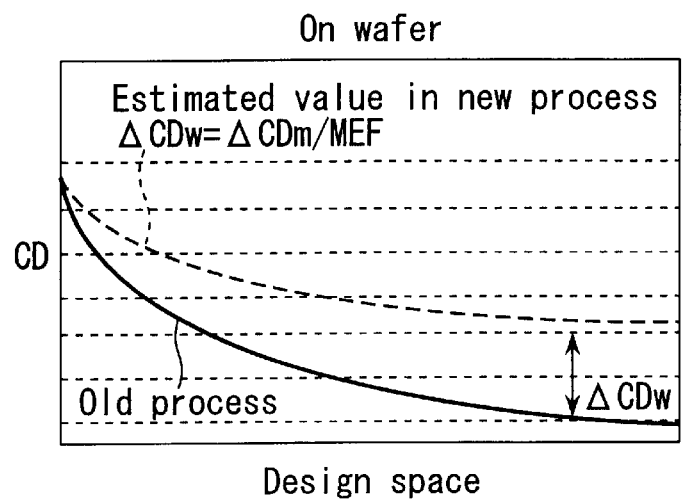
Figure 6:
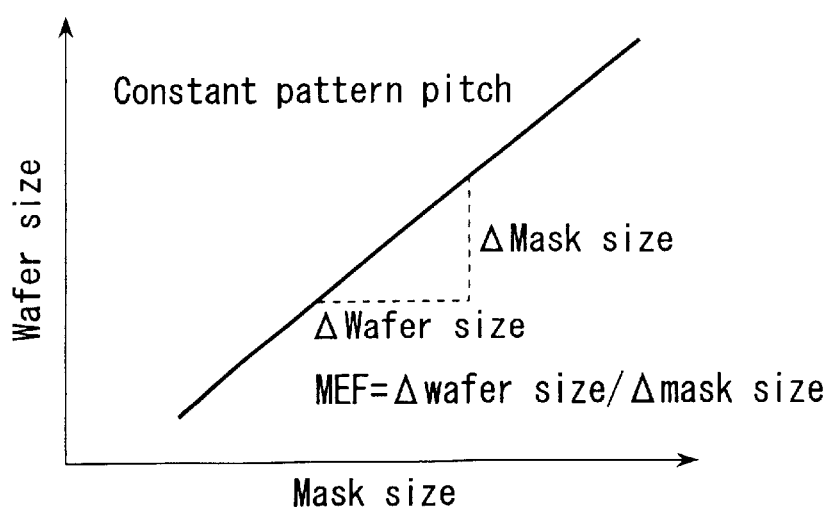
FIG. 6 is a graph for explaining the definition of MEF.

The relationship between CD and the design space on a wafer in the new mask process is obtained by calculation based on the results (mask size difference between the new and old mask processes) of steps 1 and 2 (step 3). The calculation is carried out by converting a pattern size on the mask into the pattern size on the wafer. In the calculation a factor called MEF is used, which is described later (FIGS. 5A and 5B, FIG. 6). The results of step 3 are shown in FIG. 3C.

A new OPC rule/model is prepared from the relationship between CD and the design space on the wafer that is acquired in step 3 (step 4).

In regard to the optical proximity correction (OPC) method, L. Liebmann et al. have proposed [1] a first look at manufacturability of OPC.

Figure 19:
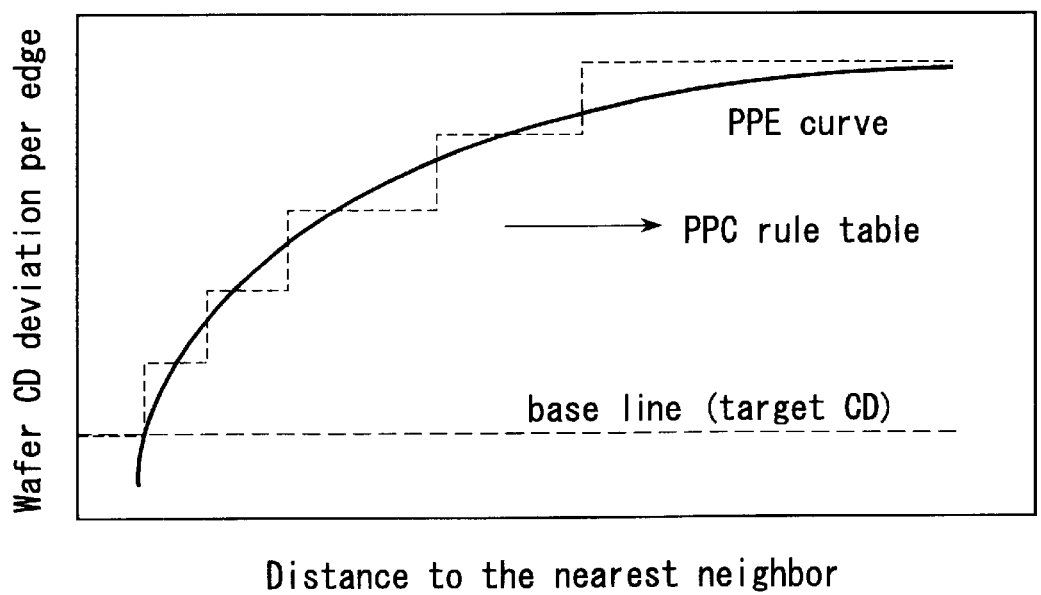
FIG. 19 is a bucket sorting method used to obtain a correction rule table.

This paper describes the one-dimensional (active gate line width), single parameter (distance to the nearest neighboring pattern), and some bucket sorting routines used to remove proximity effects on the gate structure. FIG. 19 describes the bucket sorting method used to obtain a correction rule table. Wafer CD deviations in the distance to the nearest neighbor were sorted into one of some minimum spacing ranges by a design grid.

[1] L. Liebmann, B. Grenon, M. Lavin, S. Schomody and T. Zell, "Optical Proximity Correction, a First Look at Manufacturability", Proc. SPIE in 14th Annual BACUS Symposium on Photomask Technology and Management, William L. Brodsky, Gilbert V. Shelden, Editors, Vol. 2322, pp. 229–238, 1994.

Replacement of an OPC rule/model (two-dimensional OPC replacement) when the mask process is changed will be explained in detail with reference to FIGS. 4A to 4D. In this case, a distance between pattern-end to pattern-end is used as an evaluation pattern. More specifically, as shown in FIGS. 4A and 4B, a pattern in which the distance S (design space) between the ends of two rectangular patterns nearest to each other is used as the evaluation pattern.

Figure 4A:
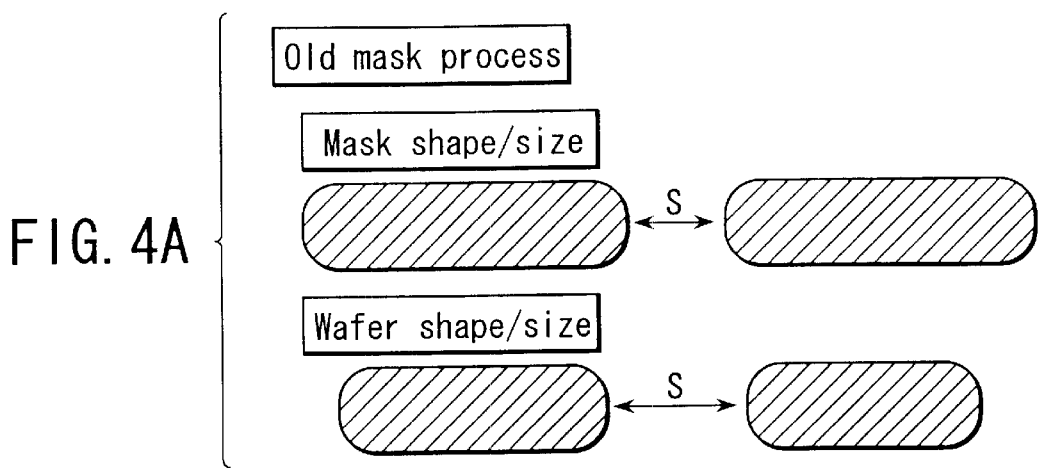
FIGS. 4A to 4D are views for explaining two-dimensional OPC replacement.
Figure 4B:
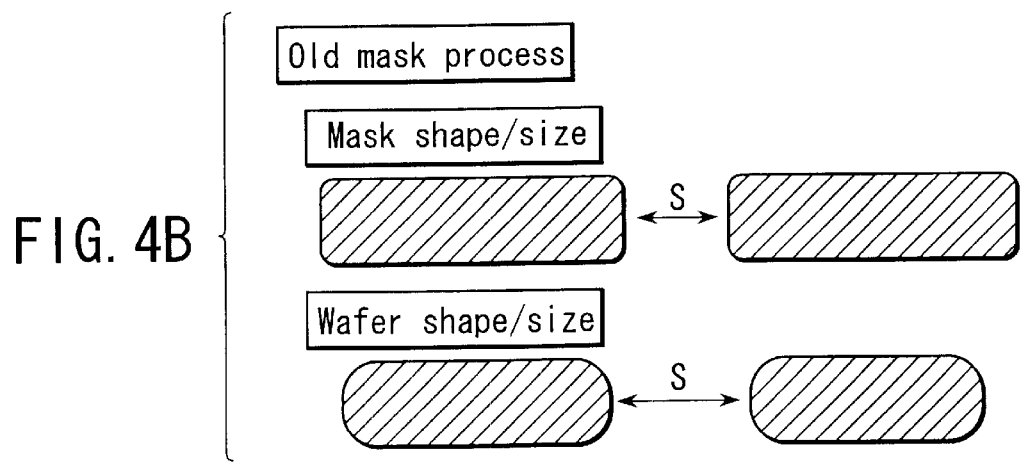
Figure 4C:
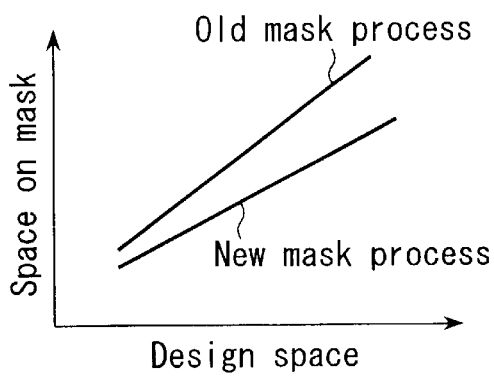

An exposure mask having the evaluation pattern of FIG. 4A is prepared using the old mask process. The relationship between the distance between the ends (space on mask) measured on the exposure mask and the distance between the ends (design space) designed in the old mask process is acquired (step 1). Similarly, an exposure mask having the evaluation pattern of FIG. 4B is prepared using the new mask process. The relationship (two-dimensional OPE curve) between the measured distance between the ends (space on mask) and the distance between the ends (design space) designed in the new mask process is acquired (step 2). The results of steps 1 and 2 are shown in FIG. 4C.

Figure 4D:
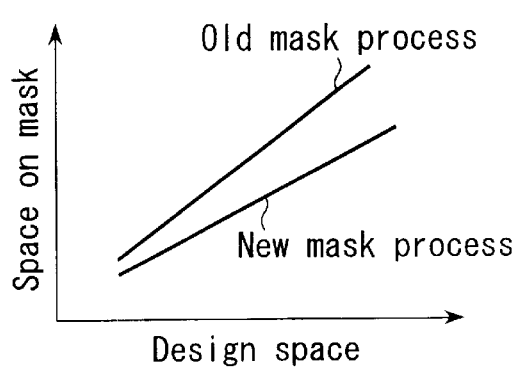

The relationship between the distance between the ends (space on mask) on a wafer in the new mask process and the distance between the ends (design space) designed in the new mask process is obtained by calculation on basis of the results (mask size difference between the new and old mask processes) of steps 1 and 2 (step 3). The results of step 3 are shown in FIG. 4D. The calculation is carried out by converting a pattern size on the mask into the pattern size on the wafer. In the calculation a factor called MEF is used, which is described later (FIGS. 5A and 5B, FIG. 6).

A new OPC rule/model is prepared from the relationship between the distance (space on mask) between the ends on the wafer and the designed distance (design space) between the ends which is acquired in step 3 (step 4).

FIGS. 5A and 5B show a method of acquiring wafer data (CD-S relationship) in the new mask process from mask data (CD-S relationship) in the new and old mask processes and wafer data (CD-S relationship) in the old mask process. This method can be applied to both one-dimensional OPC replacement and two-dimensional OPC replacement.

This method utilizes the fact that the difference ($\Delta CDm$) in CD-S relationship between the new and old mask processes on the mask is reflected on the difference ($\Delta CDw$) in CD-S relationship between the new and old mask processes on the wafer. More specifically, $\Delta CDw$ can be estimated by dividing $\Delta CDm$ by MEF (Mask CD Error Factor). As shown in FIG. 6, MEF is a factor (correlation coefficient between a changed unit process and a unit process in the subsequent step) representing the correlation between the mask size and the wafer size at a constant pattern pitch. The use of MEF provides the correspondence between a size difference on the mask and a size difference on the wafer.

(Second Embodiment)

Figure 7:
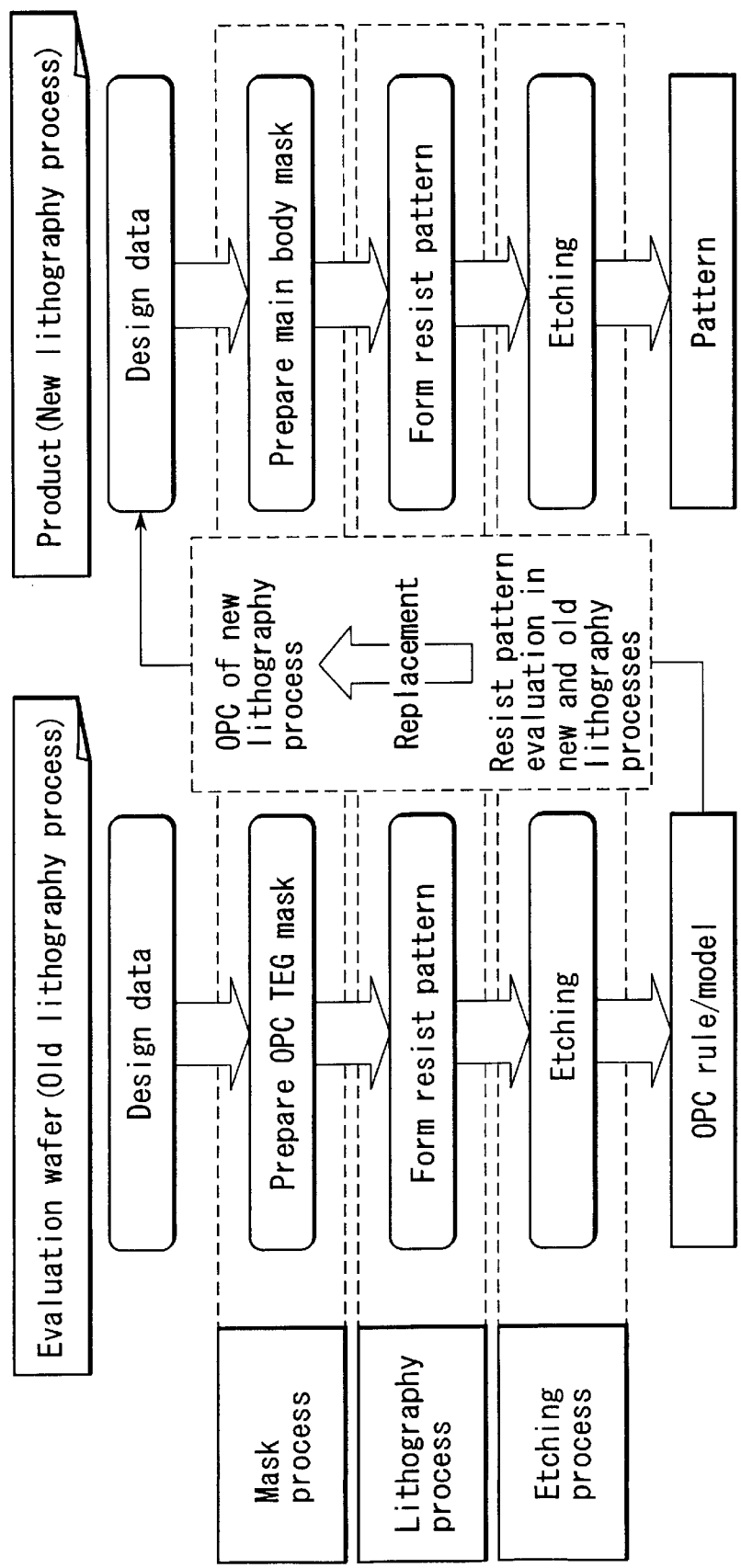
FIG. 7 is a flow chart showing the flow of a pattern formation method according to the second embodiment of the present invention when part of the unit process group is changed.

FIG. 7 is a flow chart showing the flow of a pattern formation method according to the second embodiment of the present invention when part of a unit process group is changed. This embodiment will exemplify a case wherein, of unit processes which constitute the unit process group, a lithography process has been changed. The change of the lithography process includes the change of processes such as exposure apparatus illumination conditions, resist process, and mask conditions (e.g., normal mask or phase shift mask). The change of the lithography process also includes the change of sub-processes which constitute these processes.

When the unit process (in this case, lithography process) is changed, the OPC rule/model must be newly formed. The feature of the second embodiment is a method of preparing this new OPC rule/model. The remaining part is the same as a conventional semiconductor device manufacturing method. In the following description, the new OPC rule/model preparation method will be mainly explained.

In this embodiment, an OPC rule/model (new OPC rule/model) for a new lithography process is obtained on the basis of optical proximity effect data of an evaluation mask prepared by a unit process group using a lithography process (old lithography process) before change and optical proximity effect data of an evaluation mask prepared by a unit process group using a lithography process (new lithography process) after change.

Of OPC rules/models (old OPC rules/models) before the change of the lithography process, an OPC rule/model in the lithography process is replaced by the OPC rule/model in the new lithography process. The obtained OPC rule/model (new OPC rule/model) is adopted to prepare an exposure mask (main body mask) used to form the pattern of an actual product. Then, the product pattern process is updated.

Figure 8:
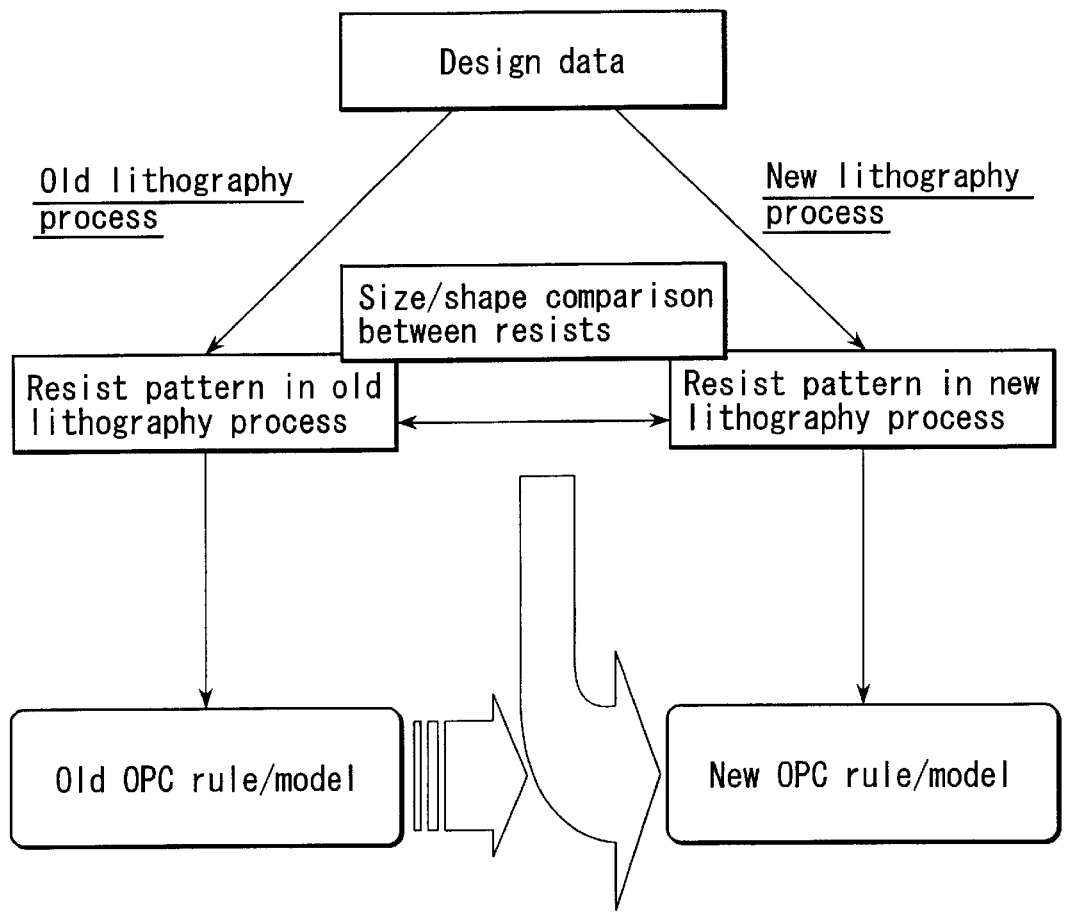
FIG. 8 is a flow chart showing the flow of a new OPC rule/model acquisition method according to the second embodiment of the present invention.

As shown in FIG. 8, information necessary to prepare an OPC rule/model in the new lithography process suffices to be the old OPC rule/model, and the resist pattern size difference or resist pattern shape difference (sectional shape difference or planar shape difference) between new and old lithography processes.

The old OPC rule/old OPC model has already been acquired. A new evaluation item necessary to prepare a new OPC rule/model is only the resist pattern size difference or resist pattern shape difference between new and old lithography processes. The present embodiment allows preparing a new OPC rule/model within a shorter time more easily than a conventional method.

(Third Embodiment)

Figure 9:
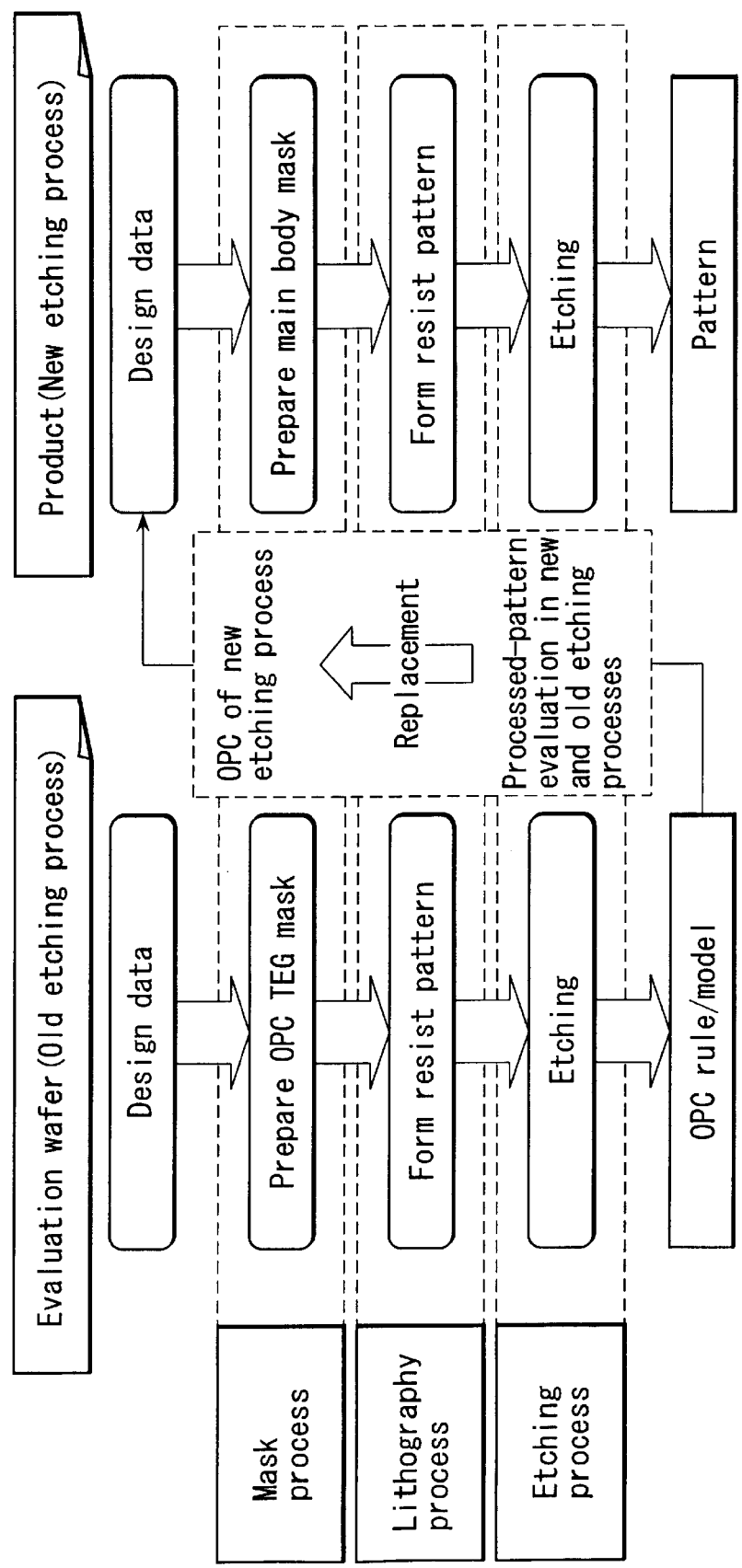
FIG. 9 is a flow chart showing the flow of a pattern formation method according to the third embodiment of the present invention when part of the unit process group is changed.

FIG. 9 is a flow chart showing the flow of a pattern formation method according to the third embodiment of the present invention when part of a unit process group is changed. This embodiment will exemplify a case wherein, of unit processes which constitute the unit process group, an etching process has been changed. The change of the etching process includes the change of an etching apparatus, etching conditions, a target etching material (including the change of film formation conditions), and the like. The change of the etching process also includes the change of sub-processes which constitute these processes.

When the unit process (in this case, etching process) is changed, the OPC rule/model must be newly formed. The feature of the present embodiment is a method of preparing this new OPC rule/model. The remaining part is the same as a conventional semiconductor device manufacturing method. In the following description, the new OPC rule/model preparation method will be mainly explained.

In this embodiment, an OPC rule/model (new OPC rule/model) for a new etching process is obtained on the basis of optical proximity effect data of an evaluation mask prepared by a unit process group using an etching process (old etching process) before change and optical proximity effect data of an evaluation mask prepared by a unit process group using an etching process (new etching process) after change.

Of OPC rules/models (old OPC rules/models) before the change of the etching process, an OPC rule/model in the etching process is replaced by the OPC rule/model in the new etching process. The obtained OPC rule/model (new OPC rule/model) is adopted to prepare an exposure mask (main body mask) used to form the pattern of an actual product. Then, the product pattern process is updated.

Figure 10:
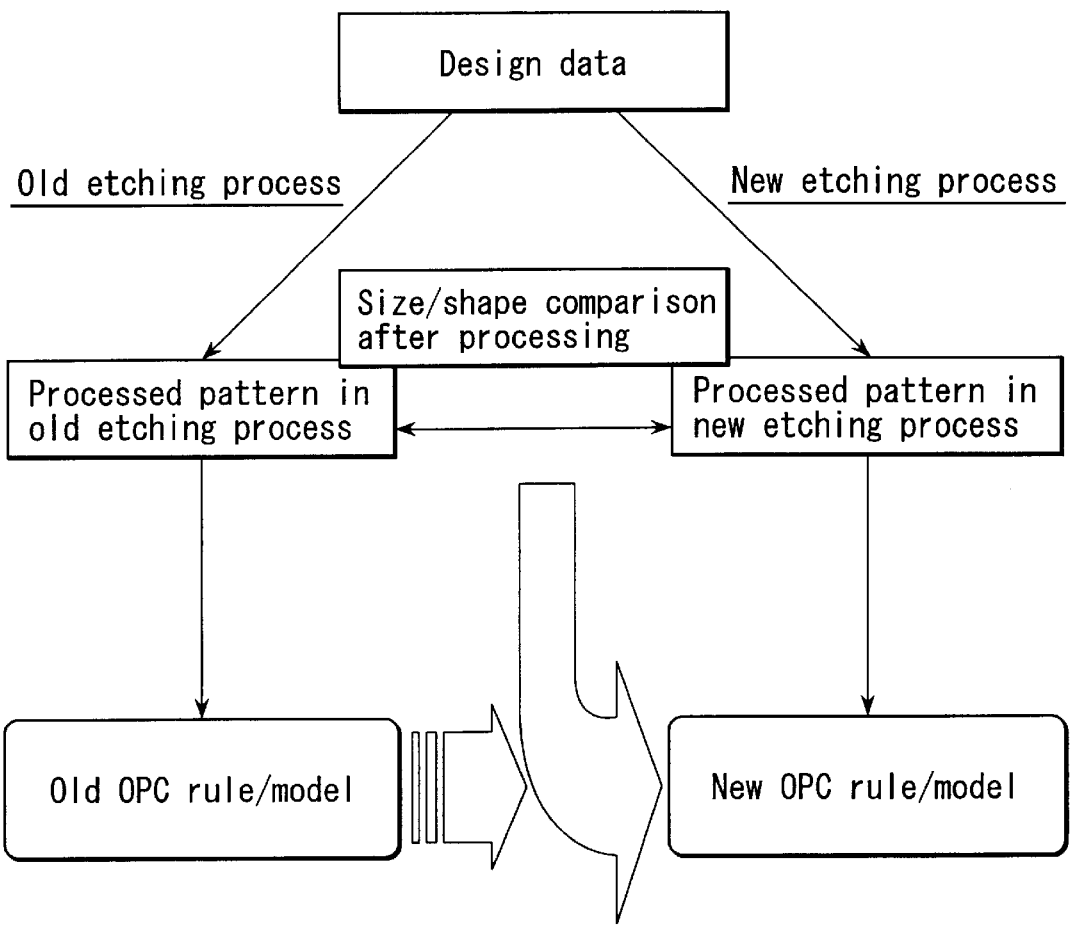
FIG. 10 is a flow chart showing the flow of a new OPC rule/model acquisition method according to the third embodiment of the present invention.

As shown in FIG. 10, information necessary to prepare an OPC rule/model in the new etching process suffices to be the old OPC rule/model, and the size difference or shape difference (sectional shape difference or planar shape difference) in target etching member between new and old etching processes.

The old OPC rule/old OPC model has already been acquired. A new evaluation item necessary to prepare a new OPC rule/model is only the size difference or shape difference in target etching member (e.g., insulating film, metal film, or semiconductor film) between new and old lithography processes. The present embodiment permits preparing a new OPC rule/model within a shorter time more easily than a conventional method.

(Fourth Embodiment)

Figure 11:
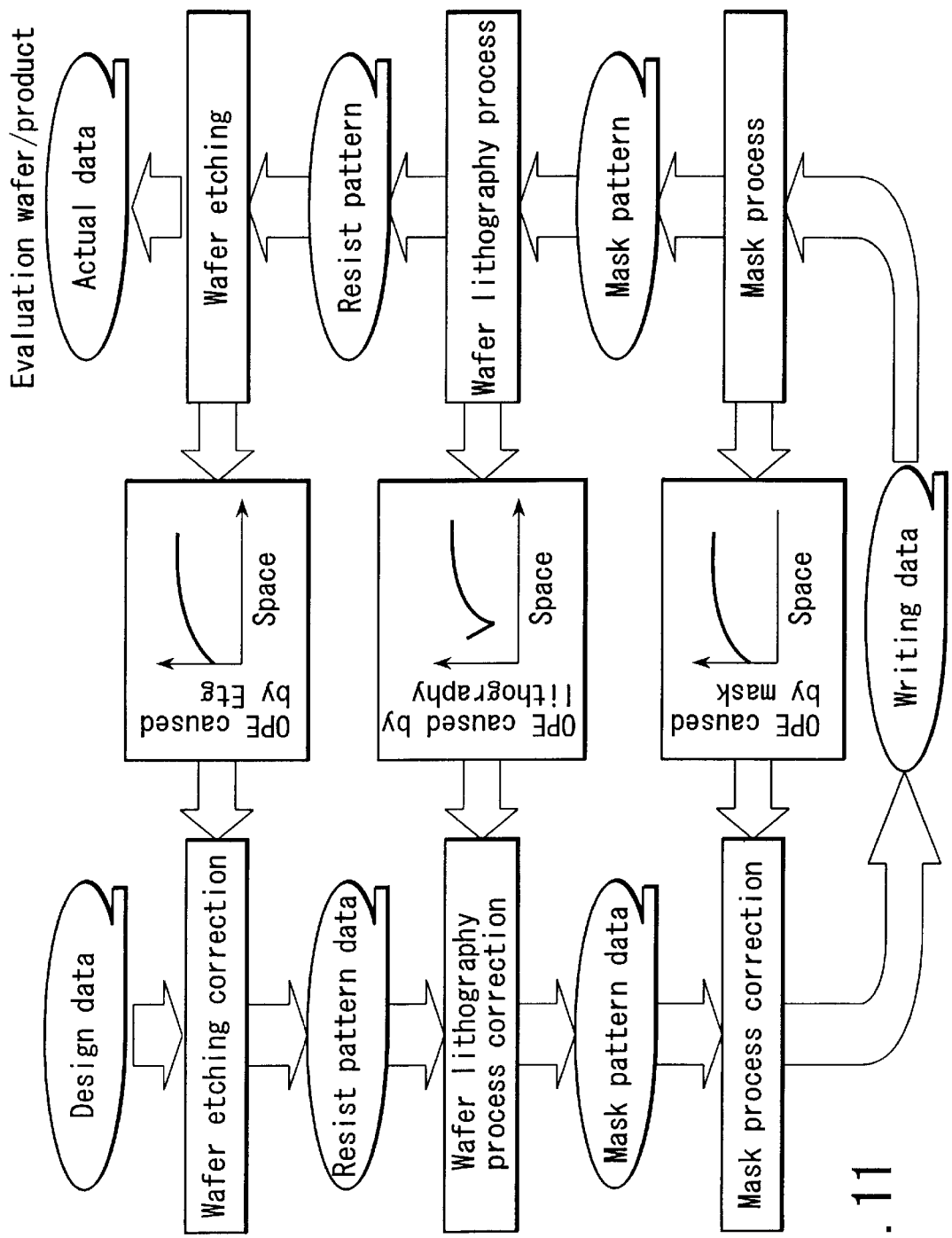
FIG. 11 is a flow chart showing the flow of an exposure mask pattern correction method according to the fourth embodiment of the present invention.

FIG. 11 is a flow chart showing the flow of an exposure mask pattern correction method according to the fourth embodiment of the present invention.

In the first to third embodiments, one of the mask process, lithography process, and etching process as unit processes which constitute a unit process group is subjected to OPC. In the fourth embodiment, all the three unit processes are subjected to OPC.

More specifically, OPC rules/models are set for respective unit processes, and the optical proximity effect of an exposure mask pattern is corrected for the respective unit processes. FIG. 11 shows a method of setting OPC rules/models in an order of the etching process, lithography process, and mask process, and correcting the optical proximity effect. At this time, OPC rules/models are replaced for only changed unit processes.

Figure 17:
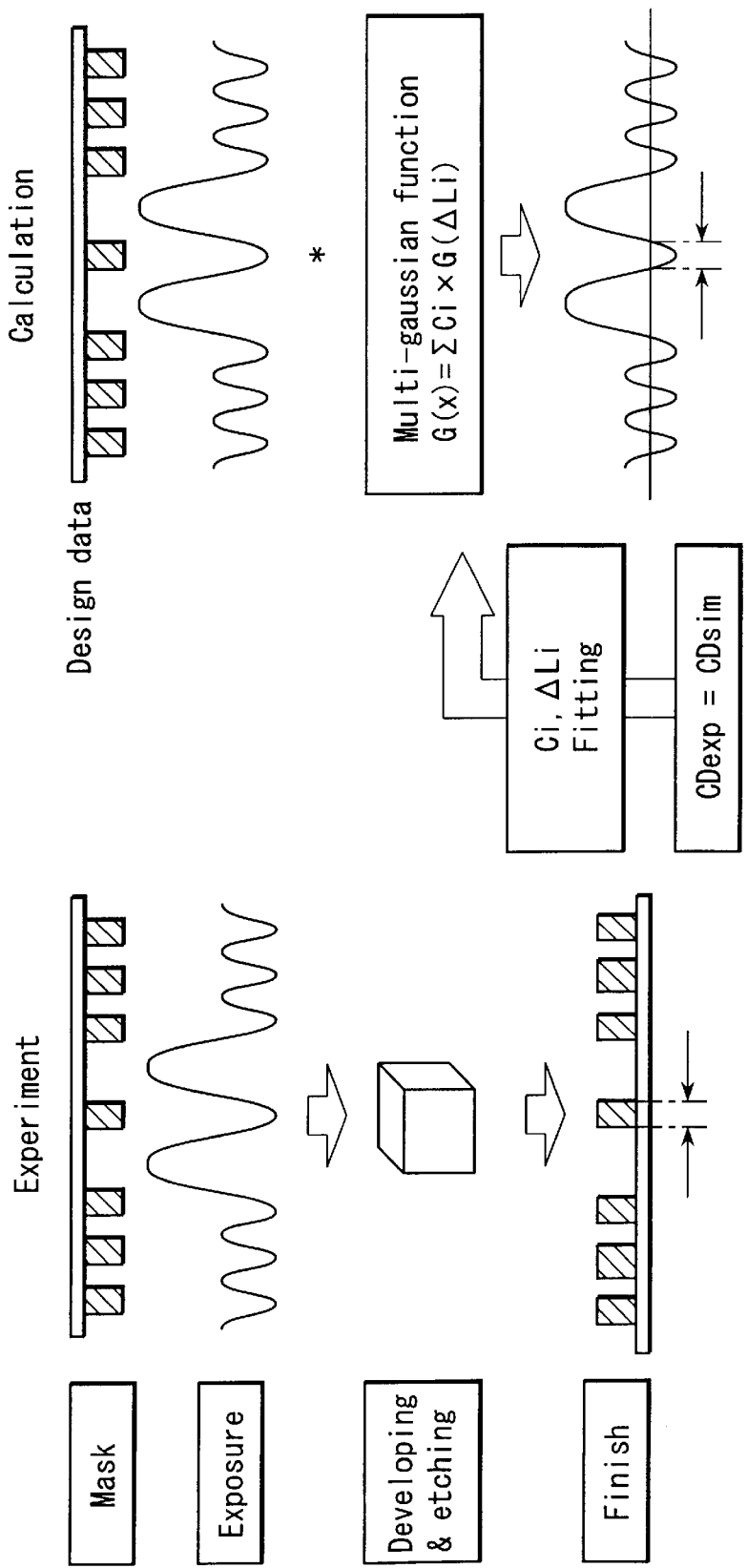
FIG. 17 is a view showing a conventional OPC modeling method.

A series of optical proximity effect correction steps provide writing data necessary to prepare an exposure mask (main body mask) used to form the pattern of an actual product. The right flow in FIG. 17 concerns both an evaluation wafer and product.

Whether an OPC rule base or OPC model base is better may change depending on the unit process. This can be determined from the dependency of OPE on the design space shown in FIG. 11 (briefly represented by "space" in FIG. 11). An appropriate OPC method (OPC rule base or OPC model base) is selected for each unit process, and the OPC model or rule is optimized to increase the OPC precision.

(Fifth Embodiment)

Figure 12:
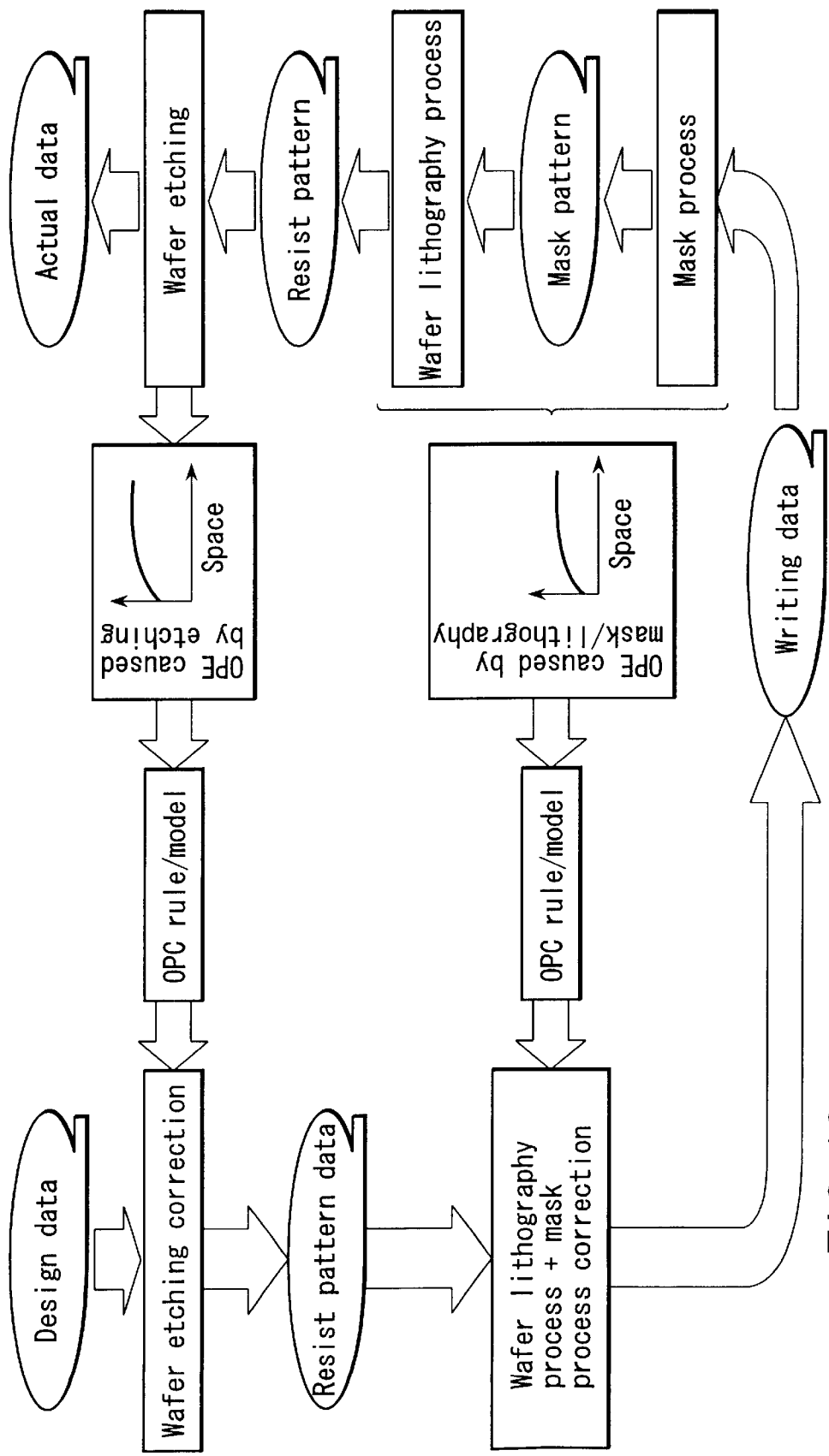
FIG. 12 is a flow chart showing the flow of an exposure mask pattern correction method according to the fifth embodiment of the present invention.

FIG. 12 is a flow chart showing the flow of an exposure mask pattern correction method according to the fifth embodiment of the present invention.

The present embodiment is different from the fourth embodiment in that OPC targets are classified into the etching process and a combined process of the mask and lithography processes. This is because the OPE of the mask process is empirically smaller than those of the remaining unit processes (lithography and etching processes). FIG. 12 shows a method of setting OPC rules/models in an order of the etching process and the (lithography process+mask process) and correcting the optical proximity effect. Since similar unit processes are combined into one by a proper OPC method, OPC processing can be simplified. This is very effective particularly when OPC targets include a process having small optical proximity effect, such as the mask process.

An OPC method suitable for the etching process and an OPC method suitable for the (lithography process+mask process) are selected. In general, the rule base is selected for the former case, and the model base is selected for the latter case. This is because the etching OPE greatly depends on the distance up to an adjacent pattern in general, and the OPE of the (lithography process+mask process) coincides with an optical model.

In the present embodiment, similar to the fourth embodiment, OPC replacement is satisfactorily performed for only changed processes. An appropriate base (OPC rule base or OPC model base) is selected for each process, increasing the OPC precision.

(Sixth Embodiment)

Recently, the optical proximity effect with respect to the pattern coverage ratio becomes prominent, and it is becoming important to perform OPC in consideration of the pattern coverage ratio. When no pattern coverage ratio is considered (prior art), an evaluation mask is prepared using a fixed coverage ratio. Then, a one-dimensional (1D) OPE curve is acquired using the evaluation mask (FIG. 13A), and an OPC rule/model is prepared based on this OPE curve and applied to a product (FIG. 13B).

To the contrary, in the present embodiment which considers the pattern coverage ratio, evaluation masks are prepared for respective coverage ratios. 1D OPE curves are acquired for the respective coverage ratios using these evaluation masks (FIG. 14A). Of these 1D OPE curves, one corresponding to the coverage ratio of a product is selected. An OPC rule/model is prepared based on the selected 1D OPE curve, and applied to pattern formation of an actual product (FIG. 14B).

FIGS. 15A to 15D show the flow of an exposure mask pattern correction method which considers the pattern coverage ratio. This embodiment will exemplify a case wherein, of unit processes which constitute the unit process group, the etching process has been changed.

Figure 15A:
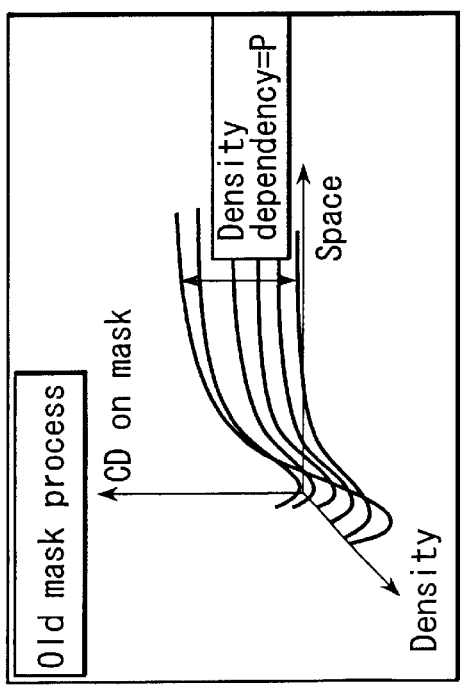
FIGS. 15A to 15D are graphs for explaining an exposure mask pattern correction method which considers the pattern coverage ratio according to the sixth embodiment of the present invention.

FIG. 15A shows a plurality of 1D OPE curves (old 1D OPE curves) having different coverage ratios on a mask in an old mask process.

Figure 15B:
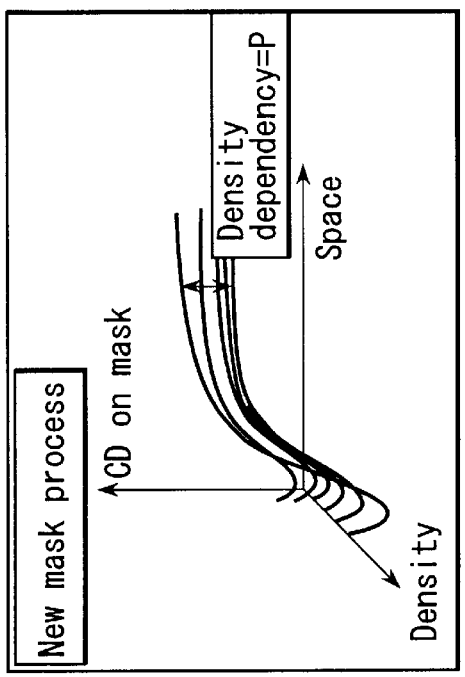

FIG. 15B reveals that sufficient processability can be obtained on a wafer by selecting an OPC rule/model (old OPC rule/model) corresponding to a 1D OPE curve for the coverage ratio of the product from the old 1D OPE curves. This processability is represented by the ratio of the allowable value (Spec.) of the OPE to the OPE having undergone proximity effect correction. The abscissas in FIGS. 15C and 15D represent the difference (the degree of variations in CD) between the maximum and minimum values of CD attained from the CD-S relationship on the wafer.

Figure 15C:
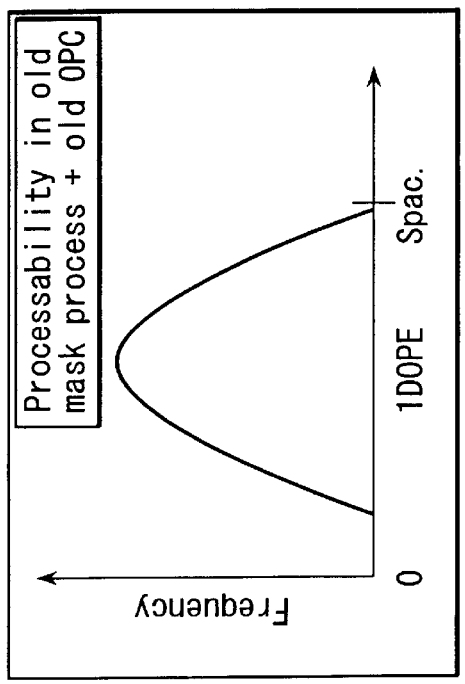

If the mask process is changed, a plurality of 1D OPE curves (new 1D OPE curves) having different coverage ratios are acquired on a mask in the new mask process, as shown in FIG. 15C.

Figure 15D:
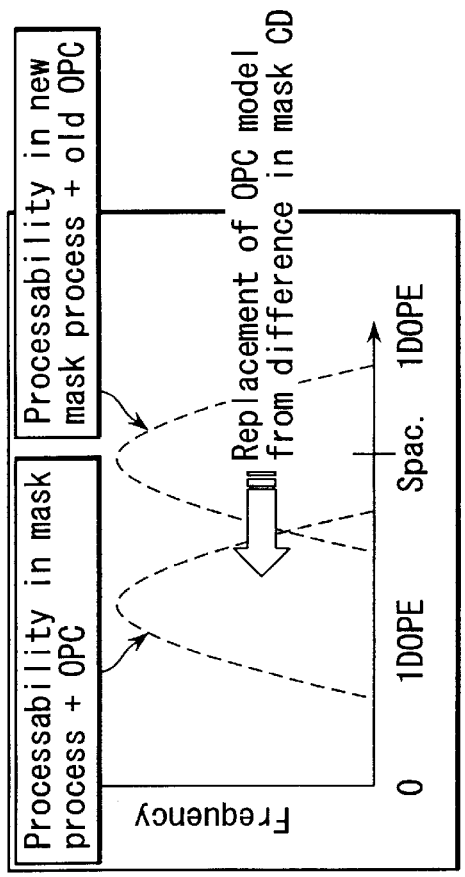
Figure 16:
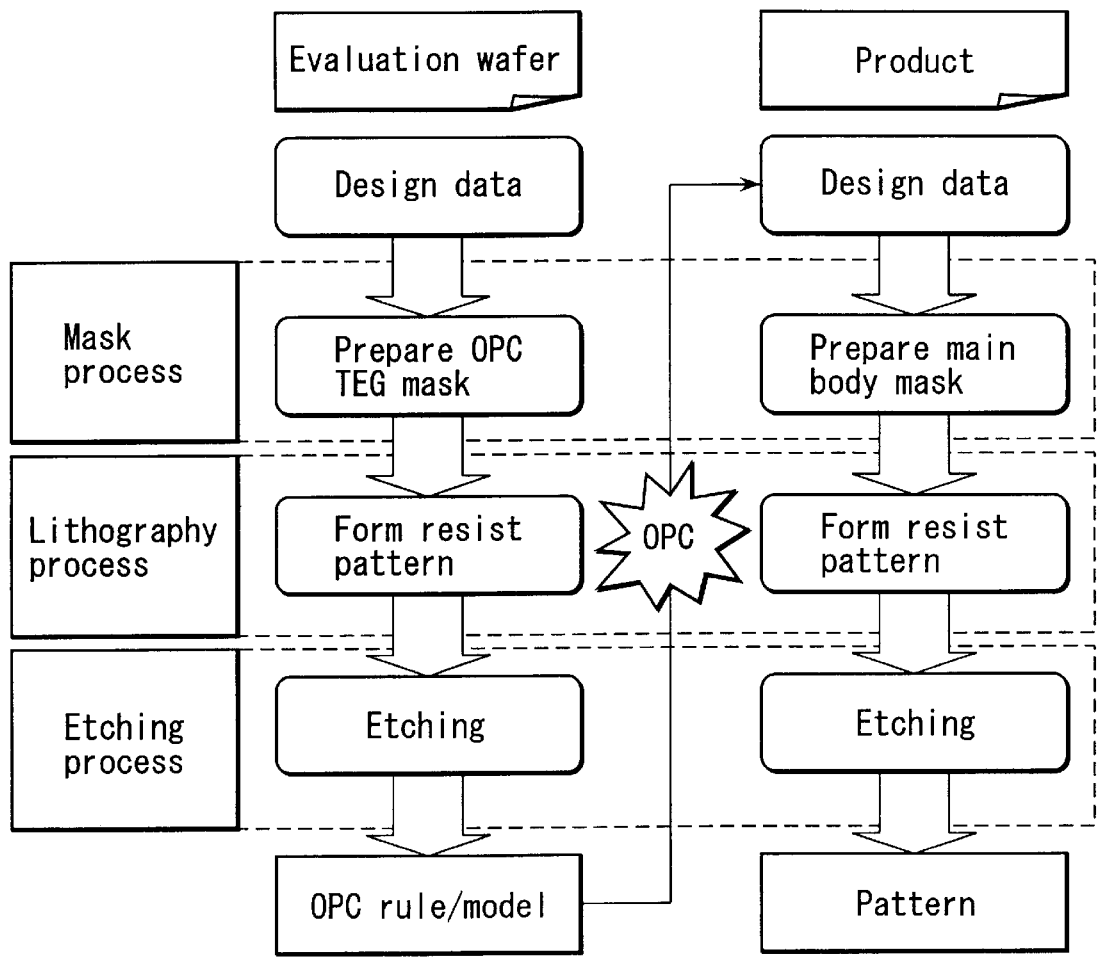
FIG. 16 is a flow chart showing the flow of a conventional pattern formation method when part of the unit process group is changed.

Then, as shown in FIG. 15D, the step abilities of the new mask process and old OPC rule/model on the wafer are acquired. At this time, if the processability falls within the allowable value (Spec.), the old OPC rule/model is used; otherwise, the OPC rule/model is so changed as to sufficiently improve the processability. This change complies with the new OPC rule/model acquisition method of the first embodiment.

In the present embodiment, the mask process is changed. The present embodiment is also effective for a case wherein the lithography process or etching process is changed.

The present invention is also applicable to a computer program product on which a program for causing a computer to execute the exposure mask pattern correction methods of the above-described embodiments. An example of the computer program product is a CD-ROM.

Figure 18:
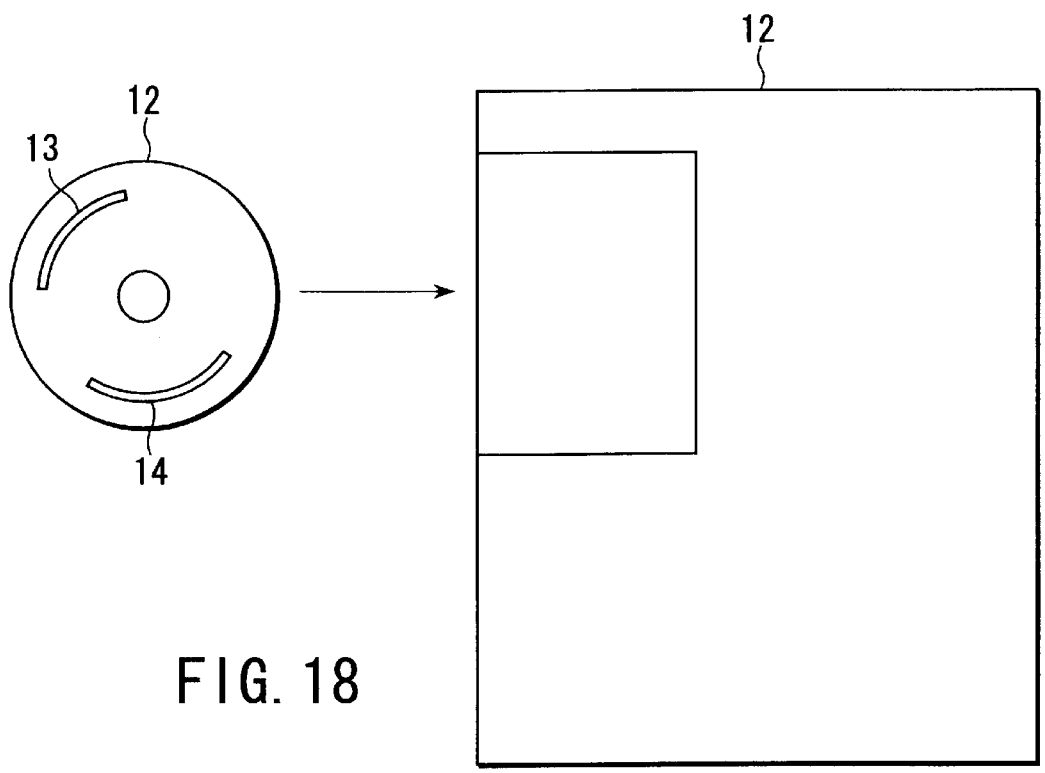
FIG. 18 is a view for explaining still another embodiment of the present invention.

More specifically, as shown in FIG. 18, a CD-ROM 11 comprises a first program instruction 13 and second program instruction 14. The first program instruction 13 causes a computer 12 to load a unit process group that includes a plurality of unit processes to form a pattern on a substrate by using an exposure mask. The plurality of unit processes includes a unit process concerning manufacture of the exposure mask, a unit process concerning lithography using the exposure mask, and a unit process concerning etching of the substrate. The second program instruction 14 is used to set a correction rule or a correction model to perform proximity effect correction for the exposure mask by using first and second optical proximity effects data when at least one of the plurality of unit processes is changed. The first optical proximity effect data is data concerning an optical proximity effect caused by the at least one unit process before the change. The second optical proximity effect data is data concerning an optical proximity effect caused by the at least one unit process after the change.

The computer program product is not limited to the CD-ROM, and may be a recording medium such as a DVD.

The present invention is not limited to the above embodiments. For example, the substrate may be a glass substrate, in addition to a substrate made of a semiconductor material such as an Si substrate (Si wafer).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure mask pattern correction method comprising:

preparing a unit process group which includes a plurality of unit processes to form a pattern on a substrate by using an exposure mask, the plurality of unit processes including a unit process concerning manufacture of the exposure mask, a unit process concerning lithography using the exposure mask, and a unit process concerning etching of the substrate;

setting a correction rule or a correction model to perform an optical proximity effect correction for the exposure mask by using first and second optical proximity effects data when a change is arisen in at least one of the plurality of unit processes, the first optical proximity effect data being data concerning an optical proximity effect caused by the at least one unit process before the change, and the second optical proximity effect data being data concerning an optical proximity effect caused by the at least one unit process after the change; and performing the optical proximity effect correction for the exposure mask by using the correction rule or the correction model.

2. The method according to claim 1, wherein the first and second optical proximity effects data include experimental data or simulation data.

3. The method according to claim 2, wherein the second optical proximity effect data includes data acquired using a correlation coefficient, the correlation coefficient defines relation between the at least one unit process after the change and a unit process subsequent to the at least one unit process after the change.

4. The method according to claim 2, wherein when at least two unit processes of the plurality of unit processes are changed, at least two optical proximity effects correction operations for correcting optical proximity effects caused by the at least two unit processes are performed one by one for the exposure mask.

5. The method according to claim 2, wherein when the unit process concerning manufacture of the exposure mask, the unit process concerning lithography using the exposure mask, and the unit process concerning etching of the substrate are changed, an optical proximity effect correction operation for correcting an optical proximity effect caused by the unit process concerning etching of the substrate is performed for the exposure mask, and an optical proximity effect correction operation for correcting an optical proximity effect caused by one combined process including the unit process concerning manufacture of the exposure mask and the unit process concerning lithography using the exposure mask is performed for the exposure mask.

6. The method according to claim 2, wherein the second optical proximity effect data includes data concerning an optical proximity effect caused by a coverage ratio of the pattern on the substrate.

7. The method according to claim 1, wherein the second optical proximity effect data includes data acquired using a correlation coefficient, the correlation coefficient defines relation between the at least one unit process after the change and a unit process subsequent to the at least one unit process after the change.

8. The method according to claim 7, wherein when at least two unit processes of the plurality of unit processes are changed, at least two optical proximity effects correction operations for correcting optical proximity effects caused by the at least two unit processes are performed one by one for the exposure mask.

9. The method according to claim 7, wherein when the unit process concerning manufacture of the exposure mask, the unit process concerning lithography using the exposure mask, and the unit process concerning etching of the substrate are changed, an optical proximity effect correction operation for correcting an optical proximity effect caused by the unit process concerning etching of the substrate is performed for the exposure mask, and an optical proximity effect correction operation for correcting an optical proximity effect caused by one combined process including the unit process concerning manufacture of the exposure mask and the unit process concerning lithography using the exposure mask is performed for the exposure mask.

10. The method according to claim 1, wherein when at least two unit processes of the plurality of unit processes are changed, at least two optical proximity effects correction operations for correcting optical proximity effects caused by the at least two unit processes are performed one by one for the exposure mask.

11. The method according to claim 1, wherein when the unit process concerning manufacture of the exposure mask, the unit process concerning lithography using the exposure mask, and the unit process concerning etching of the substrate are changed, an optical proximity effect correction operation for correcting an optical proximity effect caused by the unit process concerning etching of the substrate is performed for the exposure mask, and an optical proximity effect correction operation for correcting an optical proximity effect caused by one combined process including the unit process concerning manufacture of the exposure mask and the unit process concerning lithography using the exposure mask is performed for the exposure mask.

12. The method according to claim 1, wherein the first and second optical proximity effects data include data concerning a proximity effect caused by a coverage ratio of the pattern on the substrate.

13. A semiconductor device manufacturing method comprising:

preparing a unit process group which includes a plurality of unit processes to form a pattern on a substrate by using an exposure mask, the plurality of unit processes including a unit process concerning manufacture of the exposure mask, a unit process concerning lithography using the exposure mask, and a unit process concerning etching of the substrate;

setting a correction rule or a correction model to perform an optical proximity effect correction for the exposure mask by using first and second optical proximity effects data when a change is arisen in at least one of the plurality of unit processes, the first optical proximity effect data being data concerning an optical proximity effect caused by the at least one unit process before the change, and the second optical proximity effect data being data concerning an optical proximity effect caused by the at least one unit process after the change;

performing the optical proximity effect correction for the exposure mask by using the correction rule or the correction model; and forming the pattern on the substrate by using the exposure mask having undergone the optical proximity effect correction.

14. The method according to claim 13, wherein the first and second optical proximity effects data include experimental data or simulation data.

15. The method according to claim 14, wherein the first and second optical proximity effects data include data concerning an optical proximity effect caused by a coverage ratio of the pattern on the substrate.

16. The method according to claim 13, wherein the second optical proximity effect data includes data acquired using a correlation coefficient, and the correlation coefficient defines relation between the at least one unit process after the change and a unit process subsequent to the at least one unit process after the change.

17. The method according to claim 13, wherein when at least two of the plurality of unit processes are changed, at least two optical proximity effects correction operations for correcting optical proximity effects caused by the at least two unit processes are performed one by one for the exposure mask.

18. The method according to claim 13, wherein when at least two of the plurality of unit processes are changed, at least two optical proximity effects correction operations for correcting optical proximity effects caused by the at least two unit processes are performed one by one for the exposure mask.

19. The method according to claim 13, wherein when the unit process concerning manufacture of the exposure mask, the unit process concerning lithography using the exposure mask, and the unit process concerning etching of the substrate are changed, an optical proximity effect correction for correcting an optical proximity effect caused by the unit process concerning etching of the substrate is performed for the exposure mask, and an optical proximity effect correction for correcting an optical proximity effect caused by one combined process including the unit process concerning manufacture of the exposure mask and the unit process concerning lithography using the exposure mask is performed for the exposure mask.

20. A program product for operating a computer, the computer program product comprising:

a computer readable medium;

a first program instruction which is recorded on the medium and causes the computer to load a unit process group that includes a plurality of unit processes to form a pattern on a substrate by using an exposure mask, the plurality of unit processes including a unit process concerning manufacture of the exposure mask, a unit process concerning lithography using the exposure mask, and a unit process concerning etching of the substrate; and a second program instruction which is recorded on the medium and used to set a correction rule or a correction model to perform an optical proximity effect correction for the exposure mask by using first and second optical proximity effects data when a change is arisen in at least one of the plurality of unit processes, the first optical proximity effect data being data concerning an optical proximity effect caused by the at least one unit process before the change, and the second optical proximity effect data being data concerning an optical proximity effect caused by the at least one unit process after the change.

* * * * *